US008717794B2

(12) United States Patent
Cambou et al.

(10) Patent No.: US 8,717,794 B2
(45) Date of Patent: May 6, 2014

(54) APPARATUS, SYSTEM, AND METHOD FOR MATCHING PATTERNS WITH AN ULTRA FAST CHECK ENGINE

(75) Inventors: Bertrand F. Cambou, Palo Alto, CA (US); Neal Berger, Cupertino, CA (US); Mourad El Baraji, Fremont, CA (US)

(73) Assignee: Crocus Technology Inc., Sunnyvale, CA (US)

( * ) Notice: Subject to any disclaimer, the term of this patent is extended or adjusted under 35 U.S.C. 154(b) by 192 days.

(21) Appl. No.: 13/309,369

(22) Filed: Dec. 1, 2011

(65) Prior Publication Data

US 2012/0143889 A1    Jun. 7, 2012

Related U.S. Application Data

(60) Provisional application No. 61/493,890, filed on Jun. 6, 2011, provisional application No. 61/418,822, filed on Dec. 1, 2010.

(51) Int. Cl.
*G11C 15/02* (2006.01)

(52) U.S. Cl.
USPC ............................. 365/50; 365/49.1

(58) Field of Classification Search
USPC ............... 365/49.1, 50, 49.16, 49.17
See application file for complete search history.

(56) References Cited

U.S. PATENT DOCUMENTS

| 6,498,751 | B2 | 12/2002 | Ordonez et al. |
| 7,082,056 | B2 | 7/2006 | Chen et al. |
| 7,436,698 | B2 * | 10/2008 | Lin et al. ................ 365/158 |
| 7,486,530 | B2 | 2/2009 | Hartono et al. |
| 7,518,897 | B2 * | 4/2009 | Nozieres et al. ............ 365/50 |
| 8,228,703 | B2 * | 7/2012 | Javerliac et al. ......... 365/49.17 |

OTHER PUBLICATIONS

International Search Report and Written Opinion issued to International Patent Application No. PCT/US2011/062950, May 29, 2012, 13 pgs.

\* cited by examiner

*Primary Examiner* — Vanthu Nguyen
(74) *Attorney, Agent, or Firm* — Cooley LLP

(57) ABSTRACT

A check engine includes a plurality of comparators each including a first directional characteristic aligned to store at least one reference bit included in a set of reference bits, and a second directional characteristic aligned to present at least one target bit included in a set of target bits. Each of the plurality of comparators is configured to produce an output representing a level of matching between the at least one target bit and the at least one reference bit, based on a relative alignment between the first directional characteristic and the second directional characteristic. The check engine is configured such that the outputs of the plurality of comparators are combined to produce a combined output. The check engine is configured to determine that the set of target bits matches the set of reference bits based on the combined output of the plurality of comparators.

17 Claims, 14 Drawing Sheets

Comparison: Pattern match with Memory Based System Versus Check Engine

TAS-MRAM Implementation - Single Bit Cell - self reference

>Storage cycle:
- apply a current through the dot (provide heat)
- apply a "0" or a "1" on the field line
- cool down >Check pattern matching:
- when a "0" is applied on the field line (check a "0")
  . and a "0" is stored>>>>low resistance
  . and a "1" is stored>>>>high resistance
- when a "1" is applied on the field line (check a "1")
  . and a "1" is stored>>>>low resistance
  . and a "0" is stored>>>>high resistance

FIG. 6

8bit serial architecture:
>Check input 8 bits (k1, k2, k3, k4, k5, k6, k7, k8)
>Versus stored 8 bits (s1, s2, s3, s4, s5, s6, s7, s8)

Example: We will check the pattern (0,1,1,0,1,0,0,1)

1-Check all "0's".
>Apply all known "0's" to their respective slot (here: k1, k4, k6, k7)
>Read the end resistance
2- If necessary check all "1's".
>Apply all known "1's" to their respective slot (here: k2, k3, k5, k8)
>Read the end resistance

APPARATUS, SYSTEM, AND METHOD FOR MATCHING PATTERNS WITH AN ULTRA FAST CHECK ENGINE

CROSS-REFERENCE TO RELATED APPLICATIONS

The present application claims the benefit of U.S. Provisional Application No. 61/418,822, filed on Dec. 1, 2010, and U.S. Provisional Application No. 61/493,890, filed on Jun. 6, 2011, the disclosures of which are incorporated herein by reference in their entirety.

FIELD OF THE INVENTION

The invention relates generally to pattern checking and, more particularly, to an apparatus, system, and method for matching patterns with an ultra fast check engine.

BACKGROUND

Memory technologies can be used to store information in the form of patterns. To check that a stored pattern (e.g., a reference pattern) matches a pattern provided at some input terminal (e.g., a target pattern), it is typical to first read the reference pattern and then compare the target pattern with the reference pattern. Comparison of the target pattern with the reference pattern can yield a "yes" or a "no" matching level. FIG. 1A illustrates a conventional memory-based system to perform pattern checking. Referring to FIG. 1A, a reference pattern is stored in a memory array, and, in order to perform a comparison with a target pattern, the reference pattern is first read from the memory array. Reading the reference pattern from the memory array takes at least a few clock cycles and introduces undesirable latencies into the system. Also, comparison between the target pattern and the reference pattern is typically performed in another part of the system that is separate from the memory array, such as a crypto-processor section. As a result, the reference pattern (once read from the memory array) has to be conveyed to another part of the system, such as via a data bus. Conveyance of the reference pattern not only introduces additional latencies but also renders the reference pattern susceptible to interception or tampering while in transit.

It is against this background that a need arose to develop the apparatus, system, and method described herein.

SUMMARY

Embodiments of the invention relate to an apparatus, system, and method for matching a target pattern to a previously stored reference pattern with an ultra fast check engine. A result of the comparison can yield a "yes" or a "no" matching level, such as for purposes of security, authentication, and a number of other applications. Advantageously, the comparison between the target pattern and the reference pattern can be performed in situ within the check engine, without requiring a read operation for the reference pattern, and without requiring conveyance of the reference pattern to another part of the system. As a result, the comparison can be performed in a short time, such as about 20 ns or less, while maintaining the reference pattern within the check engine so as to reduce its exposure to interception or tampering.

In one embodiment, a check engine includes a plurality of comparators each including: (1) a first directional characteristic aligned to store at least one reference bit included in a set of reference bits; and (2) a second directional characteristic aligned to present at least one target bit included in a set of target bits. Each of the plurality of comparators is configured to produce an output representing a level of matching between the at least one target bit and the at least one reference bit, based on a relative alignment between the first directional characteristic and the second directional characteristic. The check engine is configured such that the outputs of the plurality of comparators are combined to produce a combined output. The check engine is configured to determine that the set of target bits matches the set of reference bits based on the combined output of the plurality of comparators.

In one embodiment, a method of operating a check engine includes: (1) providing a plurality of magnetic random access memory (MRAM) cells in the check engine, each of the plurality of MRAM cells including a storage magnetization and a sense magnetization; (2) storing a plurality of reference bits in the plurality of MRAM cells, including during a programming cycle, aligning the storage magnetization of the each of the MRAM cells to store at least one of the plurality of reference bits; (3) presenting a plurality of target bits to the plurality of MRAM cells, including during a pattern checking cycle, aligning the sense magnetization of the each of the plurality of MRAM cells to present at least one of the plurality of target bits; and (4) generating an output representing a level of matching between the plurality of target bits and the plurality of reference bits, based on a relative alignment between the storage magnetization and the sense magnetization of the each of the MRAM cells.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 6 illustrates operation of a thermally assisted switching-magnetic random access memory (TAS-MRAM) implementation of a check engine, according to an embodiment of the invention.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

Ultra Fast Check Engine

Figure 1A:
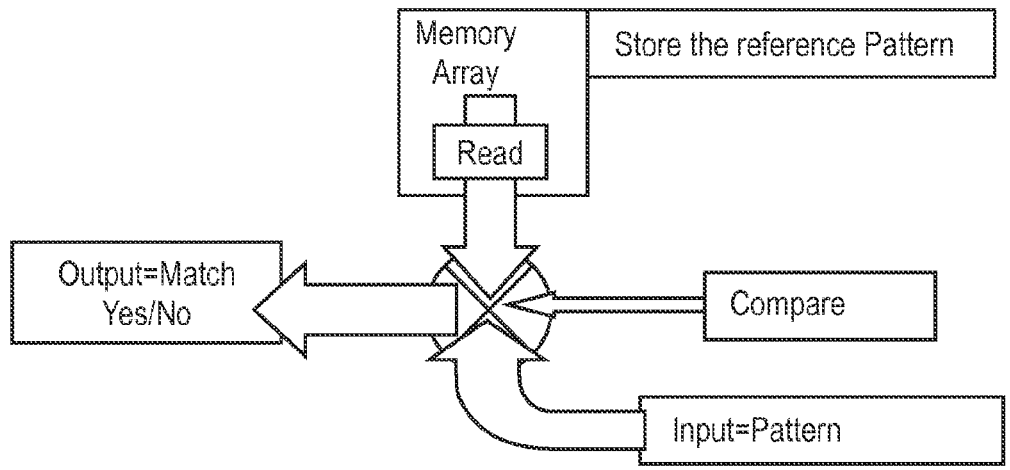
FIG. 1A illustrates a conventional memory-based system to perform pattern checking.
Figure 1B:
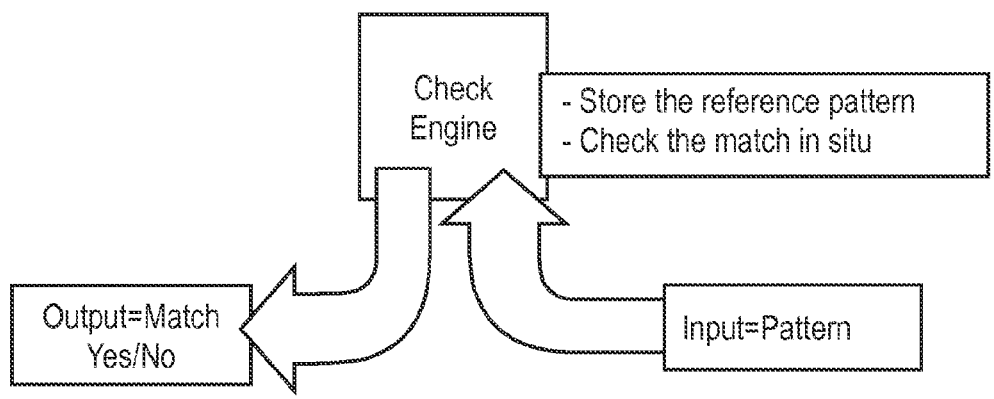
FIG. 1B illustrates an ultra fast check engine that allows for direct and in situ pattern checking, according to an embodiment of the invention.

FIG. 1B illustrates an ultra fast check engine that allows for direct and in situ pattern checking, according to an embodiment of the invention. The check engine can be implemented or made available under the designation of "Match-In-Place" (or "MIP" or "M.I.P."). The check engine addresses and overcomes the deficiencies of conventional memory-based systems, and has at least the following advantages:

(1) Faster response time to yield a "yes" or a "no" matching level, in which a single bit or a series of bits can be checked within about 20 ns or less.

(2) Enhanced security since a stored reference pattern need not be read and need not be conveyed through a data bus to another part of the system.

(3) Faster programming of stored reference patterns, in which a single bit or a series of bits can be written within about 20 ns or less. In contrast, programming cycles can take about 1,000 times longer with conventional non-volatile memories.

(4) Lends itself to zero knowledge proof architectures and techniques, such as where an entire pattern need not be checked to yield a "yes" or a "no" matching level with a high confidence.

(5) Allows lower cost system solutions since a compare function is directly integrated within the check engine, thereby obviating separate circuitry to implement such a compare function.

Figure 2:
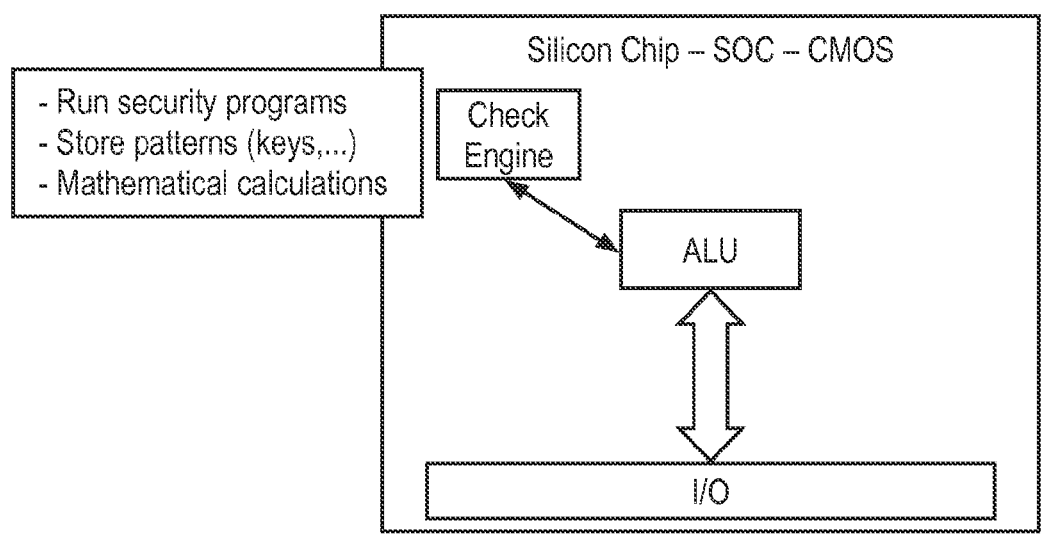
FIG. 2 illustrates a system on chip ("SOC") in which a check engine is embedded as part of the SOC, according to an embodiment of the invention.

FIG. 2 illustrates a system on chip ("SOC") in which a check engine is embedded as part of the SOC, according to an embodiment of the invention. Referring to FIG. 2, the check engine operates in conjunction with an arithmetic logic unit ("ALU"), or any other microcontroller, to run a security program, store and compare patterns, perform mathematical calculations, or any of a number of other applications. Advantageously, manufacturing operations for the check engine are compatible with a number of complementary metal-oxide-semiconductor ("CMOS") manufacturing processes. Specifically, the check engine can be manufactured by including a few additional wafer processing layers, after a basic CMOS process and before an assembly process. Although FIG. 2 illustrates the check engine as part of the SOC, it is contemplated that the check engine can be implemented in a number of other ways, such as part of a separate chip, as a dedicated circuitry to perform pattern checking, as part of the ALU, as part of a system in package, and so forth.

Applications of Ultra Fast Check Engine

Embodiments of a check engine can be advantageously used in a number of applications involving a comparison between a target pattern and a reference pattern, whether for purposes of pattern matching, pattern recognition, pattern mining, pattern searching, or other purposes. For example, a check engine can be included within, or can operate in conjunction with, a smart card, a bank card, or another portable device to implement a security function (e.g., by checking patterns corresponding to security passwords, electronic keys, and cryptographic keys or by implementing zero knowledge proof techniques), an authentication function (e.g., by checking patterns to verify the identity of a bearer of the smart card), to facilitate commercial transactions (e.g., by checking patterns for electronic payment and electronic ticketing), and so forth. When implemented within smart cards or other portable devices, a check engine can operate in conjunction with Near Field Communication ("NFC") or another wireless communication technology to allow input of target patterns and exchange of data. As an additional example, a check engine can be included within, or can operate in conjunction with, an identity document (e.g., an electronic passport, a driver's license, or an electronic identity card) to implement an authentication function (e.g., by checking patterns to verify the identity of a bearer of an electronic passport or to verify the authenticity of the electronic passport). As further examples, a check engine can be used to implement object navigation and tracking (e.g., by checking patterns corresponding to position or angular coordinates), mathematical calculations, data compression, cache tags, and networking functions (e.g., Ethernet address lookup, address filtering, and lookup of routing information in the context of switches, firewalls, bridges, routers, and other networking devices).

Figure 3:
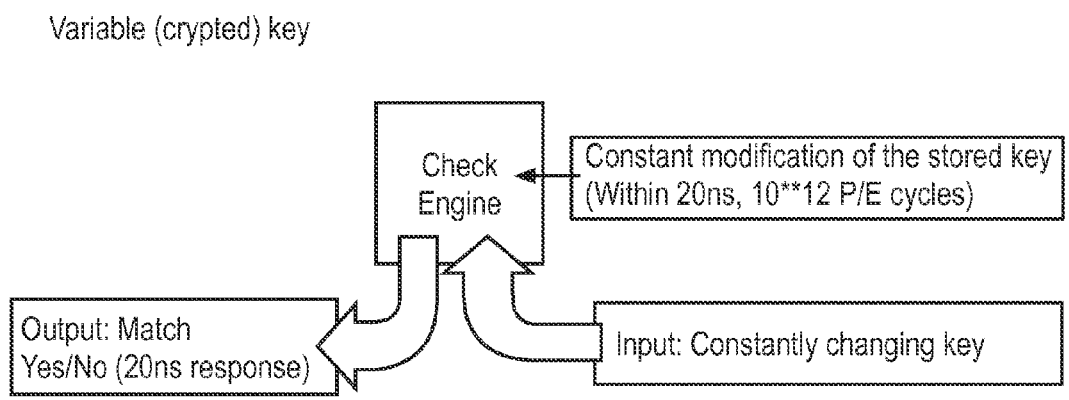
FIG. 3 illustrates one application of a check engine involving a comparison of variable patterns (or keys), according to an embodiment of the invention.

FIG. 3 illustrates one application of a check engine involving a comparison of variable patterns (or keys), according to an embodiment of the invention. Leveraging the fast programming capability of the check engine, a stored reference pattern (or a stored key) can be adjusted or varied using a pre-arranged routine or scheme, such as in a periodic, random, or substantially continuous fashion. This variation of the stored reference pattern can further enhance the level of security and further reduce the risk of unauthorized access into the system. In this case, even if a hacker was able to extract a stored key at an initial time, the hacker is still blocked from access at a later time, since the stored key is varied in accordance with the pre-arranged routine. Unlike conventional memory technologies, such as flash memories, the check engine can be implemented with little or no aging after repetitive program/erase ("P/E") cycles, such as up to about $10^{12}$ P/E cycles or more without noticeable degradation. The check engine of FIG. 3 can be advantageously implemented for electronic passports, bank cards, and other applications in which it is desirable to apply a changing key for higher levels of positive authentications.

Figure 4:
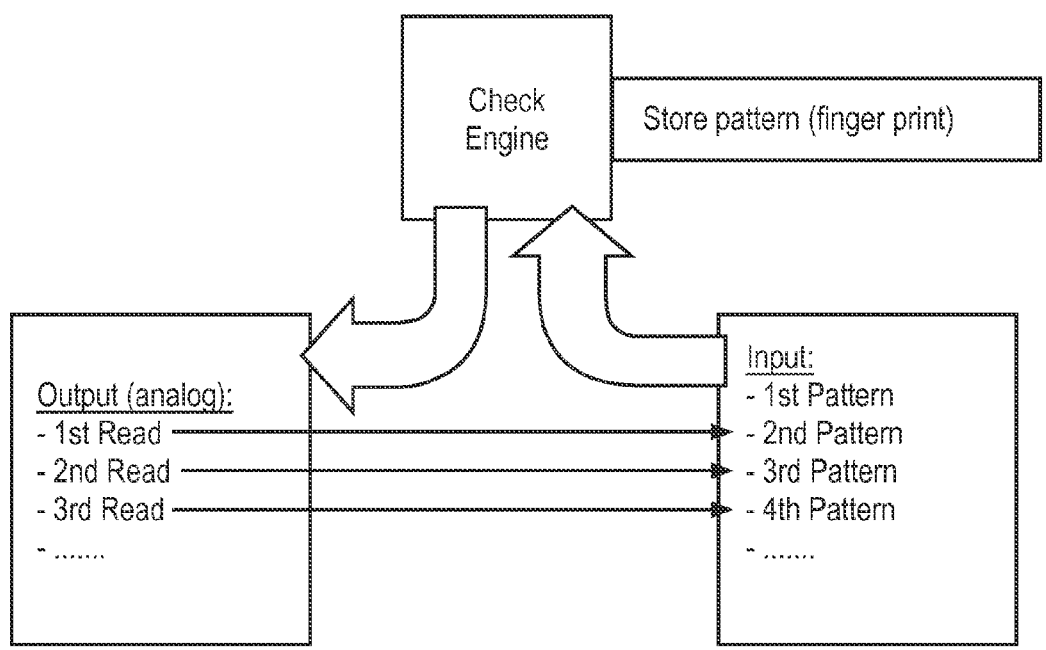
FIG. 4 illustrates another application of a check engine implemented as part of an iterative process in accordance with an embodiment of the invention.

For certain applications, such as fingerprint recognition, a pattern may change slightly overtime, such as due to dry skin, finger cuts, dirt, varying angles at which the pattern is obtained, and so forth. Because a check engine can produce an analog output to measure the level of matching or the quality of a match, this analog output can be processed as part of an iterative process as illustrated in FIG. 4 in accordance with an embodiment of the invention. Specifically, a feedback loop links an output to a modification of an input (e.g., a small change in the shape or position of a pattern or the angle at which the pattern is obtained), thereby allowing the system to rapidly converge towards a decision of "yes" or "no". A similar iterative process can be applied in the context of object navigation and tracking, such as in a robotic environment to move an arm or another part of a robot to a desired position or orientation.

Single-Bit Architecture of Ultra Fast Check Engine

Figure 5:
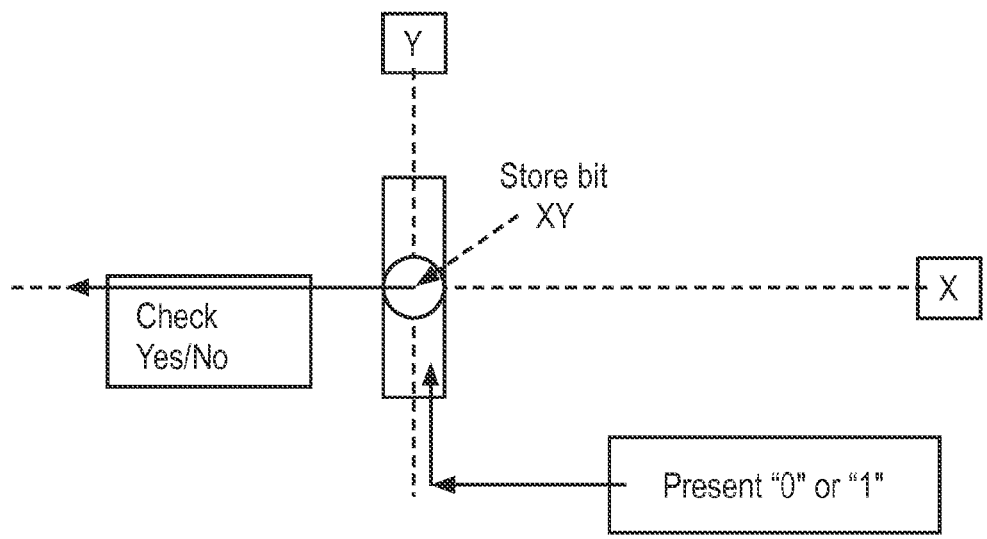
FIG. 5 illustrates a comparator that can be included in a check engine, according to an embodiment of the invention.

FIG. 5 illustrates a comparator that can be included in a check engine, according to an embodiment of the invention. Although one comparator is illustrated in FIG. 5, it is contemplated that multiple comparators can be included in the check engine. In the illustrated embodiment, the comparator includes a pair of directional or vectorial characteristics, one of which is used to represent a stored data value corresponding to a reference pattern (or a portion of the reference pattern), and another of which is used to represent a target data value to be compared with the stored data value and corresponding to a target pattern (or a portion of the target pattern). Referring to FIG. 5, each of the pair of directional characteristics is variable or switchable between a pair of directions corresponding to a pair of logic states, namely "0" and "1". In other words, the comparator is a single-bit cell that can be used to store and compare a single-bit data value, although multi-bit implementations are also contemplated. An output of the comparator is dependent upon, or influenced by, a relative alignment of the pair of directional characteristics. In such manner, the output of the comparator can take on a particular value (or a particular range of values) when the target data value matches the stored data value, and can take on a different value (or a different range of values) when the target data value does not match the stored data value.

One example of a suitable directional characteristic is a magnetization direction, which can be aligned by applying a magnetic field. Specifically, and as further explained below, the comparator can be implemented with one magnetization, namely a storage magnetization, that is aligned to represent the stored data value, and another magnetization, namely a sense magnetization, that is aligned to represent the target data value. Conventional memories can be susceptible to unauthorized data access by using techniques to derive a charge state of a capacitor. In contrast, the use of magnetization directions renders the comparator of FIG. 5 less susceptible to such unauthorized data access, thereby further enhancing the level of security. It is contemplated that other electrical, chemical, magnetic, and optical characteristics having a directional or vectorial component can be used in place of, or in conjunction with, magnetization directions.

Still referring to FIG. 5, each comparator of the check engine can be programmed in a fashion similar to programming a conventional non-volatile memory, namely XY coordinates of an array or a matrix can be used to select a particular comparator through a respective bit line (e.g., extending along the X direction) and a respective selection transistor. In contrast to a conventional memory, each bit can be rapidly programmed, such as within about 20 ns or less, or multiple bits (e.g., up to 512 bits or more) can be concurrently programmed within a similar time period. The comparator can be very rugged, and about $10^{12}$ or more P/E cycles can be carried out without noticeable degradation. Additional wear leveling techniques can be implemented to further increase the ruggedness of the comparator with respect to multiple P/E cycles.

In a pattern checking mode, the comparator acts as a two terminal device, namely a "0" or a "1" is presented at an input of the comparator, and a response of "yes" or "no" based on the match is presented at an output of the comparator. In the case of a pair of magnetization directions, a "0" or a "1" can be presented by applying a magnetic field induced by a field line (e.g., extending along the Y direction). The output of the comparator can be analog in nature. For example, in the case of a pair of magnetization directions, a low resistance value (e.g., about 1 KΩ) can be presented for a "yes" match (e.g., when the magnetization directions are substantially parallel), while a high resistance value (e.g., about 2 KΩ) can be presented for a "no" match (e.g., when the magnetization directions are substantially antiparallel). Advantageously, pattern checking can be performed in situ within the comparator and with a short response time, such as within about 20 ns or less, without requiring a read operation for a stored data value, and without requiring conveyance of the stored data value to another part of the system.

As can be appreciated, the comparator of FIG. 5 can advantageously operate as a built-in exclusive-OR ("XOR") circuitry. Specifically, if a stored data value is a "0", an output of the comparator can be a high resistance value if a target data value is a "1" (e.g., when the magnetization directions are substantially antiparallel), and can be a low resistance value if the target data value is a "0" (e.g., when the magnetization directions are substantially parallel). Likewise, if the stored data value is a "1", the output of the comparator can be a high resistance value if the target data value is a "0" (e.g., when the magnetization directions are substantially antiparallel), and can be a low resistance value if the target data value is a "1" (e.g., when the magnetization directions are substantially parallel). The comparator provides the advantages of integrating data storage and data comparison functions within the comparator, thereby allowing cost efficient implementations and conserving valuable footprint area on a wafer. The comparator can also combine these advantages with low power consumption and high-speed operation.

Logical Block Diagram of Ultra Fast Check Engine

Figure 11:
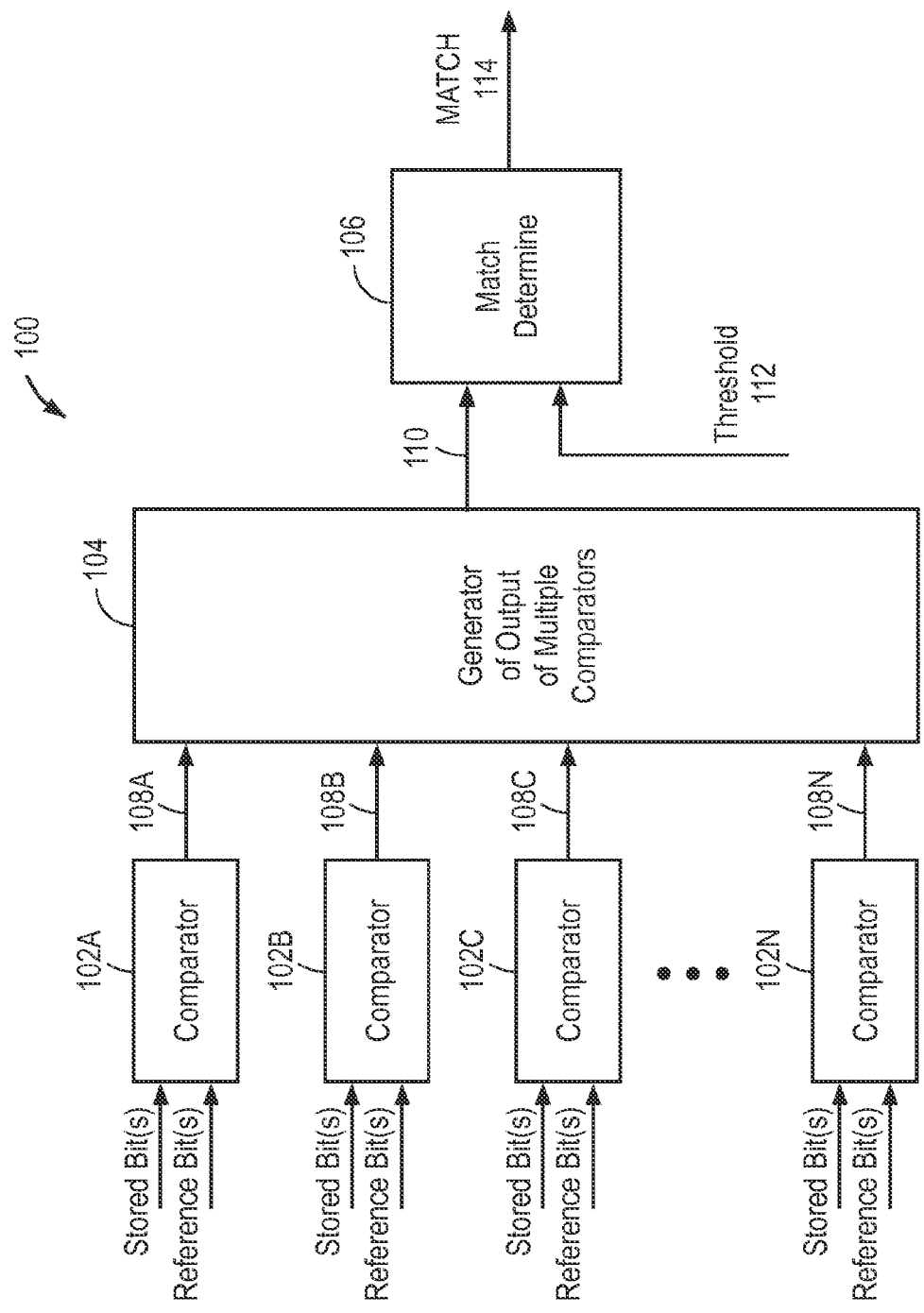
FIG. 11 illustrates a logical block diagram of a check engine, according to an embodiment of the invention.

FIG. 11 illustrates a logical block diagram of a check engine 100, according to an embodiment of the invention. The check engine 100 includes one or more comparators 102A-102N, a generator 104 of an output of the comparators 102, and a match determiner 106. As described with reference to FIGS. 5 and 14, each of the comparators 102 stores one or more reference bits and receives one or more target bits, and generates an output 108 that represents a level of matching between the one or more target bits and the one or more reference bits. The outputs 108A-108N of the comparators 102A-102N are provided to the generator 104. The generator 104 may generate an output 110 based on the outputs 108A-108N of the individual comparators 102A-102N. The output 110 of the generator 104 may represent a level of matching across the comparators 102. The output 110 may then be provided to a match determiner 106, which may compare the output 110 to a threshold 112 to determine a match output 114. The match output 114 may represent a determination by the check engine 100 as to whether the reference pattern stored in the comparators 102 matches the target pattern applied to the comparators 102.

In one embodiment, the generator 104 may evaluate the individual outputs 108A-108N to determine how many of the comparators 102A-102N individually detected a match. Alternatively, the generator 104 may aggregate (combine) the outputs 108A-108N. The output 110 may correspond to a number of the comparators 102 that individually detected a match, or a percentage of the comparators 102 that individually detected a match.

In one embodiment, the threshold 112 may be set such that a match is determined (e.g., the match output 114 is asserted) when not all of the bits of the target pattern match corresponding bits of the reference pattern, e.g., one or more bits of the target pattern does not match a corresponding one or more bits of the reference pattern. This type of processing may be helpful for applications such as fingerprint matching where identifying a "perfect" match can be less important that other applications. In another embodiment, the threshold 112 may be set such that a match is determined when all of the bits of the target pattern match the corresponding one or more bits of the reference pattern.

Multi-Bit Serial Architecture of Ultra Fast Check Engine

Figure 12:
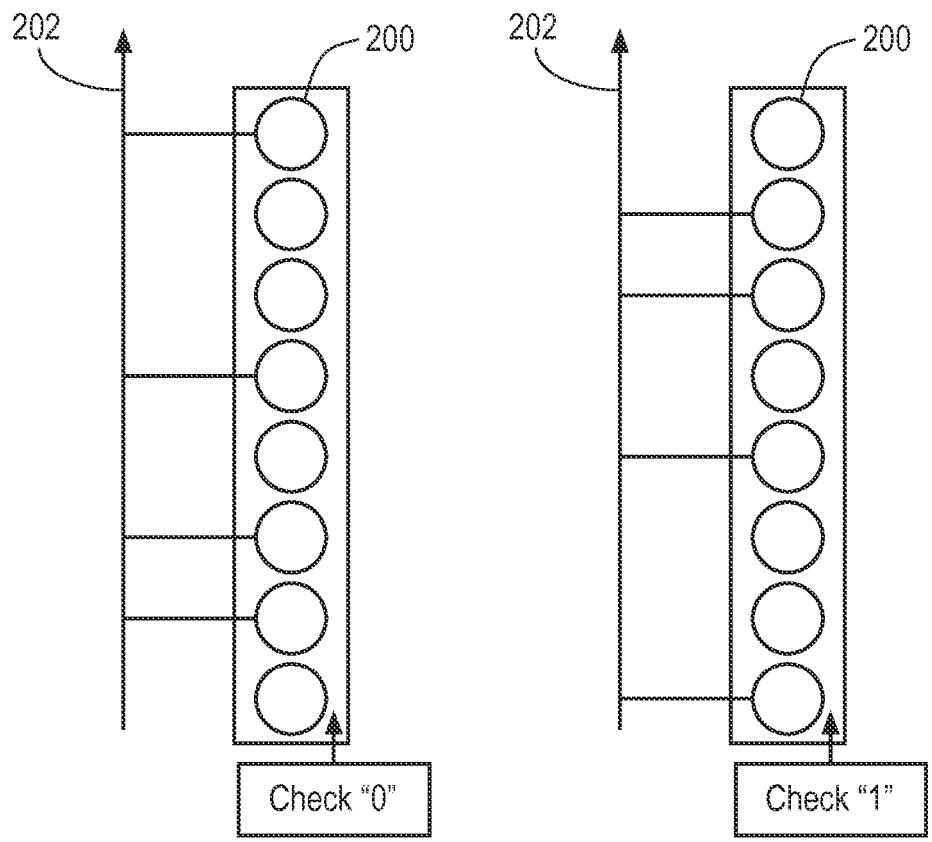
FIG. 12 illustrates multiple comparators that can be included in a check engine, according to an embodiment of the invention.

FIG. 12 illustrates multiple comparators 200 that can be included in a check engine, according to an embodiment of the invention. Similar to the comparator of FIG. 5, each comparator 200 of FIG. 12 is a single-bit cell that can be used to store and compare a single-bit data value. Referring to FIG. 12, 8 comparators 200 are included to allow checking of 8-bit patterns, although it is contemplated that more or less comparators can be included in the check engine. Here, the comparators 200 are connected together through a common input line 202, which extends along the Y direction and is shared by the comparators 200. For example, the input line 202 can correspond to a field line, which can apply a magnetic field to program a set of reference bits during a programming cycle or to present a set of target bits during a pattern checking cycle.

In the illustrated embodiment, "0's" and "1's" of a target pattern are checked in separate cycles. In one cycle, all "0's" of the target pattern are checked concurrently by presenting a "0" through the input line 202 and selecting particular ones of the comparators 200 (which are candidates for storing "0's") through their respective bit lines (e.g., extending along the X direction) and their respective selection transistors. A result of checking for "0's" can account for an output of each selected comparator 200, or can correspond to an aggregate of some, or all, of the outputs of the selected comparators 200. For example, the result can be a "yes" if there is a positive match for each selected comparator 200, and can be a "no" otherwise. As another example, the result can be a "yes" if there is a positive match for at least a particular percentage of the selected comparators 200, and can be a "no" otherwise. If the result of checking for "0's" is a "no", a next cycle to check "1's" can be skipped. Also, even if all "0's" are checked as a "yes", a decision can be made to skip the next cycle and assert that a match is statistically likely. If a higher level of certainty is desired, all "1's" can be checked concurrently in the next cycle by presenting a "1" through the input line and selecting particular ones of the comparators 200 (which are candidates for storing "1's") through their respective bit lines and their respective selection transistors. An overall result of checking can be available within about 20 ns or less if only "0's" are checked, and within about 2×20 ns if both "0's" and "1's" are checked in successive cycles.

The architecture of FIG. 12 can be extended for the design of 16-bit, 32-bit, 64-bit, 128-bit, and higher bit serial architectures by including additional comparators along the input line, such as by including 16 comparators for a 16-bit design. If a higher level of certainty is desired for a positive match, the number of bits to be checked concurrently can be set lower than when a lower level of certainty is sufficient. Depending upon the particular implementation, a large number of bits checked concurrently can have a lower level of certainty due to a degraded signal-to-noise ratio. For fingerprint recognition, as an example, a relatively large number of bits can be checked concurrently, since identifying a "perfect" match can be less important that other applications. In the case of checking electronic keys, a large key can be parsed and segmented into smaller increments that are separately checked to allow a higher level of certainty.

Other implementations of a multi-bit serial architecture are contemplated. For example, multiple comparators can be connected together through a common bit line, rather than a common input line (or a common field line). Here, each comparator can operate with a separate, dedicated input line (or a separate, dedicated field line) and a selection transistor, which can be activated serially or concurrently during a programming cycle. During pattern checking, the comparators can be checked serially using the common bit line, with one comparator selected during a particular pattern checking cycle. Stated in another way, multiple comparators of a check engine can be located in a particular row of an array or a matrix, in a particular column of the array or the matrix, or a combination thereof.

Multi-Bit Serial Architecture of Ultra Fast Check Engine Using Opposite Bits

Figure 13:
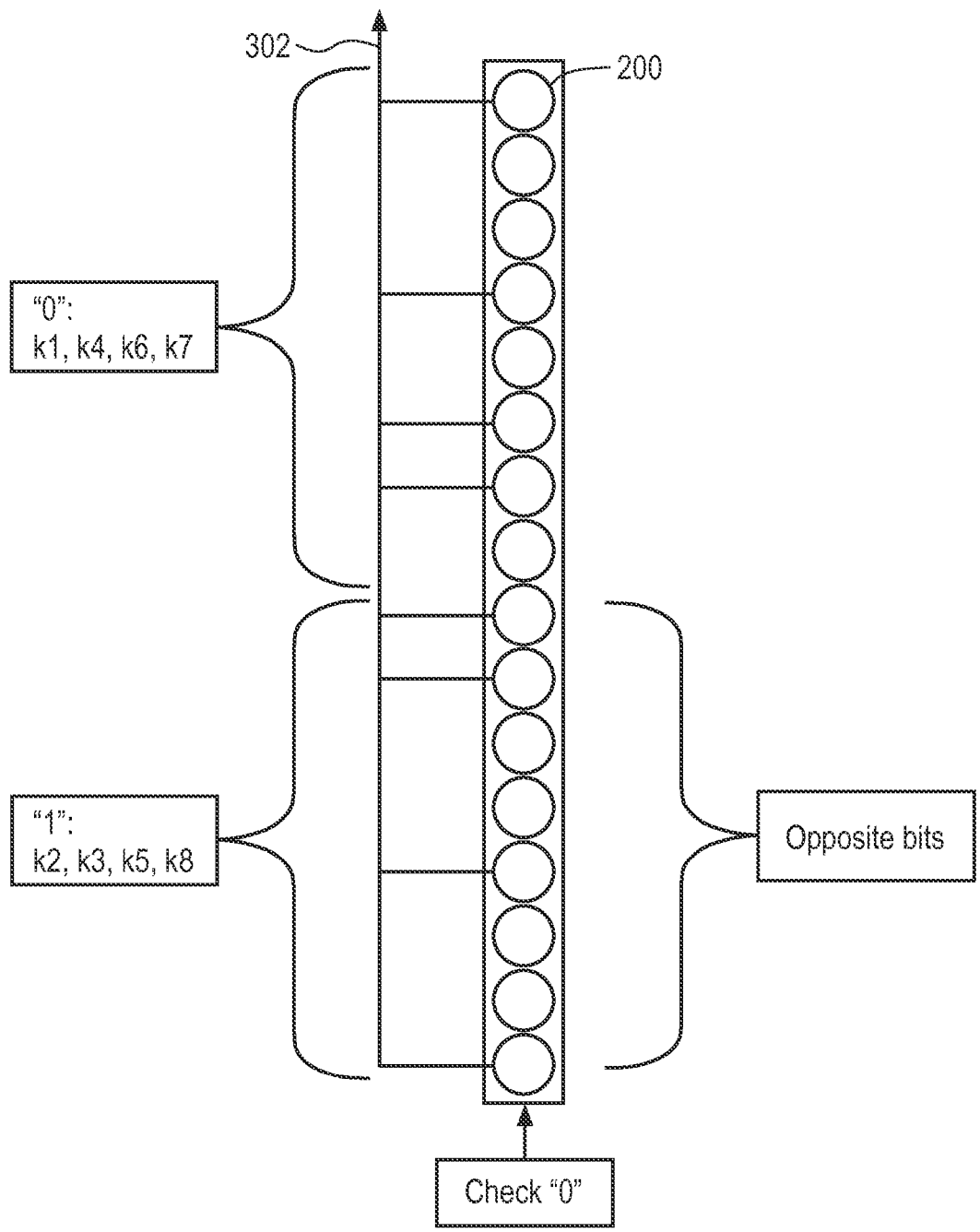
FIG. 13 illustrates multiple comparators that can be included in a check engine, according to an embodiment of the invention.

FIG. 13 illustrates multiple comparators 200 that can be included in a check engine, according to another embodiment of the invention. Similar to the comparator of FIG. 5, each comparator 200 of FIG. 13 is a single-bit cell that can be used to store and compare a single-bit data value. Referring to FIG. 13, 16 comparators 200 are included to allow checking of all "0's" and all "1's" of an 8-bit target pattern in a single cycle. Specifically, an 8-bit reference pattern is programmed in a first group of 8 comparators 200 (e.g., the first 8 comparators 200 along an input line 302), and the ones' complement of the 8-bit reference pattern (namely, where all "0's" are replaced by "1's" and vice versa) is programmed in a second group of 8 comparators 200 (e.g., the next 8 comparators 200 along the input line 302). In such manner, all "0's" and all "1's" of a target pattern can be checked concurrently in a single cycle, by presenting a "0" through the input line 302 and selecting particular ones of the comparators 200 in the first group of 8 comparators 200 (which are candidates for storing "0's") and selecting particular ones of the comparators 200 in the second group of 8 comparators 200 (which are candidates for storing "1's"). A result of checking can be available within about 20 ns or less.

The architecture of FIG. 13 can be extended for the design of 16-bit, 32-bit, 64-bit, 128-bit, and higher bit serial architectures by including additional comparators along the input line, such as by including 32 comparators for a 16-bit design. Although a footprint area of the architecture of FIG. 13 can be about twice that of the architecture of FIG. 12, the architecture of FIG. 13 allows pattern checking to be performed about twice as fast, while providing a high level of certainty. The architecture of FIG. 13 can be desirable for security applications such as checking of electronic keys.

Thermally Assisted Switching ("TAS")-Magnetic Random Access Memory ("MRAM") Implementation of Ultra Fast Check Engine TAS technology, as applied to MRAM's, provides one way of implementing the check engines explained herein. FIG. 6 illustrates the operation of a TAS-MRAM implementation of a check engine, according to an embodiment of the invention. Specifically, the check engine includes a magnetic tunnel junction (or a magnetic cell or dot), in which a pinning layer is disposed adjacent to a storage layer having a storage magnetization direction. The cell also includes a sense layer having a sense magnetization direction. During a programming cycle, a relatively small current is applied through the cell to heat the pinning layer by Ohmic effect. When a temperature of the pinning layer is above a threshold temperature, the storage magnetization direction is unpinned, thereby allowing a single bit to be programmed by applying a current through a field line that is magnetically connected to the cell. A "0" can be stored by applying the current in one particular direction, and a "1" can be stored by applying the current in an opposite direction. After programming, the cell is cooled below the threshold temperature, thereby pinning the storage magnetization in a programmed direction. In a pattern checking cycle, a "0" or a "1" is presented by activating the field line to switch the sense magnetization direction, in a manner consistent with directions used for the programming cycle. The cell has a typical resistance value of about 1 KΩ when the two magnetization directions are substantially parallel, and about 2 KΩ when the two magnetization directions are substantially antiparallel.

Figure 7:
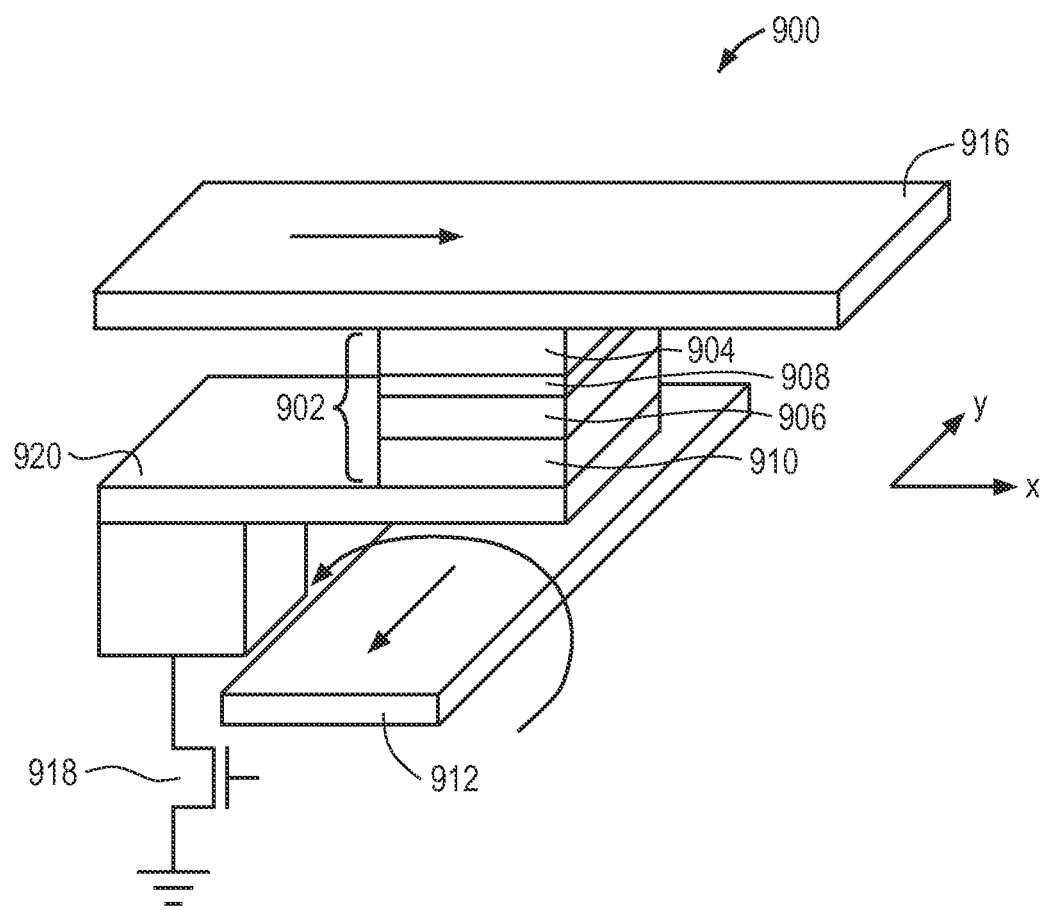
FIG. 7 illustrates a magnetic cell that can be included in a check engine, according to an embodiment of the invention.

Further details of a TAS-MRAM implementation of a check engine 900 can be appreciated with reference to FIG. 7, which illustrates a magnetic cell 902 included in the check engine 900, according to an embodiment of the invention. For ease of presentation and to motivate certain advantages and functions of the check engine 900, the single magnetic cell 902 is illustrated in FIG. 7, although it is contemplated that multiple magnetic cells can be included.

Referring to FIG. 7, the magnetic cell 902 is implemented as a magnetic tunnel junction, and includes a sense layer 904, a storage layer 906, and a layer 908 that is disposed between the sense layer 904 and the storage layer 906. Other implementations of the magnetic cell 902 are contemplated. For example, the relative positioning of the sense layer 904 and the storage layer 906 can be reversed, with the storage layer 906 disposed above the sense layer 904.

Each of the sense layer 904 and the storage layer 906 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 904 and the storage layer 906 can include the same ferromagnetic material or different ferromagnetic materials. As illustrated in FIG. 7, the sense layer 904 can include a soft ferromagnetic material, namely one having a relatively low coercivity, while the storage layer 906 can include a hard ferromagnetic material, namely one having a relatively high coercivity. In such manner, a magnetization of the sense layer 904 can be readily varied under low-intensity magnetic fields during pattern checking cycles, while a magnetization of the storage layer 906 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 904 and the storage layer 906 can be in the nm range, such as from about 1 nm to about 20 nm or from about 1 nm to about 10 nm. Other implementations of the sense layer 904 and the storage layer 906 are contemplated. For example, either, or both, of the sense layer 904 and the storage layer 906 can include multiple sub-layers in a fashion similar to that of the so-called synthetic antiferromagnetic layer.

The layer 908 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the layer 908 can be in the nm range, such as from about 1 nm to about 10 nm.

In the illustrated embodiment, the magnetic cell 902 is implemented to store data corresponding to one of a pair of logic states. In other words, the magnetic cell 902 is a single-bit cell that stores a single-bit data value, although multi-bit implementations for storing multi-bit data values are also contemplated. In accordance with the single-bit implementation of the magnetic cell 902, the storage layer 906 has a storage magnetization that is switchable between a pair of directions corresponding to the pair of logic states. Referring to FIG. 7, the magnetic cell 902 also includes a pinning layer 910, which is disposed adjacent to the storage layer 906 and, through exchange bias, stabilizes the storage magnetization along a particular one of the pair of directions when a temperature within, or in the vicinity of, the pinning layer 910 is lower than a blocking temperature $T_{BS}$, or another threshold temperature such as a Neel temperature. The pinning layer 910 unpins, or decouples, the storage magnetization direction when the temperature is at, or above, the blocking temperature $T_{BS}$, thereby allowing the storage magnetization direction to be switched to another one of the pair of directions. In contrast, such a pinning layer is omitted adjacent to the sense layer 904, and, as a result, the sense layer 904 has a sense magnetization direction that is unpinned and is readily varied, with the substantial absence of exchange bias. The pinning layer 910 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the blocking temperature $T_{BS}$ of alloys based on Ir and Mn (or based on Fe and Mn) can be in the range of about 120° C. to about 220° C. or about 150° C. to about 200° C., and can be smaller than the blocking temperature $T_{BS}$ of alloys based on Pt and Mn (or based on Ni and Mn), which can be in the range of about 300° C. to about 350° C.

Still referring to FIG. 7, the check engine 900 also includes a set of traces (or strip conductors) to provide programming and pattern checking functions. Specifically, a bit line 916 is electrically connected to the magnetic cell 902 on the side of the sense layer 904 and is substantially orthogonal to a field line 912, which is disposed below and magnetically connected to the magnetic cell 902 on the side of the storage layer 906. The check engine 900 further includes a transistor 918, which is electrically connected, through a strap 920, to the magnetic cell 902 on the side of the storage layer 906. The transistor 918 is switchable between a blocked mode (OFF) and a saturated mode (ON), thereby allowing the flow of a current through the magnetic cell 902. Other implementations of the check engine 900 are contemplated. For example, the relative orientation of the bit line 916 and the field line 912 can be varied from that illustrated in FIG. 7. As another example, the relative positioning of the bit line 916 and the field line 912 can be reversed, with the field line 912 disposed above the bit line 916.

During a TAS-type programming cycle, the magnetic cell 902 is heated by applying a heating current through the magnetic cell 902 via the bit line 916, with the transistor 918 in a saturated mode. The magnetic cell 902 is heated to a temperature above the blocking temperature $T_{BS}$ of the pinning layer 910, such that a magnetization of the storage layer 906 is unpinned. Simultaneously or after a short time delay, the field line 912 is activated to induce a write magnetic field to switch the storage magnetization from an initial direction to another direction. Specifically, a write current is applied through the field line 912 to induce the write magnetic field to switch the storage magnetization direction, according to a reference bit to be stored. Because the storage magnetization direction can be aligned according to the write magnetic field, the storage magnetization direction can be switched between multiple directions according to a programming encoding scheme. One possible encoding scheme is implemented with a pair of directions that are displaced by about 180°, such that a "0" is assigned to one of the pair of directions, and a "1" is assigned to another one of the pair of directions.

Once the storage magnetization is switched to a programmed direction, the transistor 918 is switched to a blocked mode to inhibit current flow through the magnetic cell 902, thereby cooling the magnetic cell 902. The write magnetic field can be maintained during cooling of the magnetic cell 902, and can be deactivated once the magnetic cell 902 has cooled below the blocking temperature $T_{BS}$ of the pinning layer 910. Because the storage magnetization direction is pinned by the exchange bias of the pinning layer 910, its orientation remains stable so as to retain the stored data.

Other implementations of programming cycles are contemplated. For example, the magnetic cell 902 can be implemented with an anisotropic shape having a relatively high aspect ratio, such as about 1.5 or more. In such an anisotropic-shaped implementation of the magnetic cell 902, the storage magnetization direction can be switched and can remain stable, without requiring the pinning layer 910. As another example, a programming cycle can be carried out by applying a write current through the magnetic cell 902 via the bit line 916, using the so-called spin transfer torque ("STT") effect. In such a STT-type programming cycle, the write current can become spin polarized by passing through a polarizing magnetic layer (not illustrated) or through the sense layer 904, and a magnetization of the storage layer 906 can be switched according to a spin-polarized orientation of the write current. Switching of the storage layer magnetization with the spin-polarized write current also can be combined with a TAS-type programming cycle, such as by heating the magnetic cell 902 above the blocking temperature $T_{BS}$ and then applying the spin-polarized write current through the magnetic cell 902.

During a pattern checking cycle, the field line 912 is activated to induce a compare magnetic field to vary a magnetization of the sense layer 904. Specifically, a compare current is applied through the field line 912 to induce the compare magnetic field to vary the sense magnetization direction, according to a target bit to be compared with a reference bit. Because the sense layer 904 is subject to little or no exchange bias, the sense magnetization direction can be readily varied under low-intensity magnetic fields and at a temperature below the blocking temperature $T_{BS}$, while the storage magnetization remains stable in a programmed direction. The field line 912 is activated to induce the compare magnetic field that is consistent with a programming encoding scheme. Because the sense magnetization direction can be aligned according to the compare magnetic field, the sense magnetization direction can be switched to a particular direction assigned to a "0" or a "1", according to the target bit presented for comparison.

As part of the pattern checking cycle, a degree of alignment between the sense magnetization direction and the storage magnetization direction is determined by applying a sense current through the magnetic cell 902 via the bit line 916, with the transistor 918 in a saturated mode. Measuring a resulting voltage across the magnetic cell 902 when the sense current is applied yields a resistance value of the magnetic cell 902 for a particular direction of the sense magnetization corresponding to a particular target bit. Alternatively, a resistance value can be determined by applying a voltage across the magnetic cell 902 and measuring a resulting current. When the respective magnetizations of the sense layer 904 and the storage layer 906 are antiparallel, a resistance value of the magnetic cell 902 typically corresponds to a maximum value, namely $R_{max}$, and, when the respective magnetizations are parallel, a resistance value of the magnetic cell 902 typically corresponds to a minimum value, namely $R_{min}$. A resulting resistance value of the magnetic cell 902 can be compared with a reference resistance value $R_{ref}$, which represents an in-between resistance value between $R_{max}$ and $R_{min}$. A matching response of "yes" or "no" can be determined based on whether the resistance value of the magnetic cell 902 is greater than $R_{ref}$, which indicates an antiparallel alignment between the magnetization directions, or smaller than $R_{ref}$, which indicates a parallel alignment between the magnetization directions.

Figure 14:
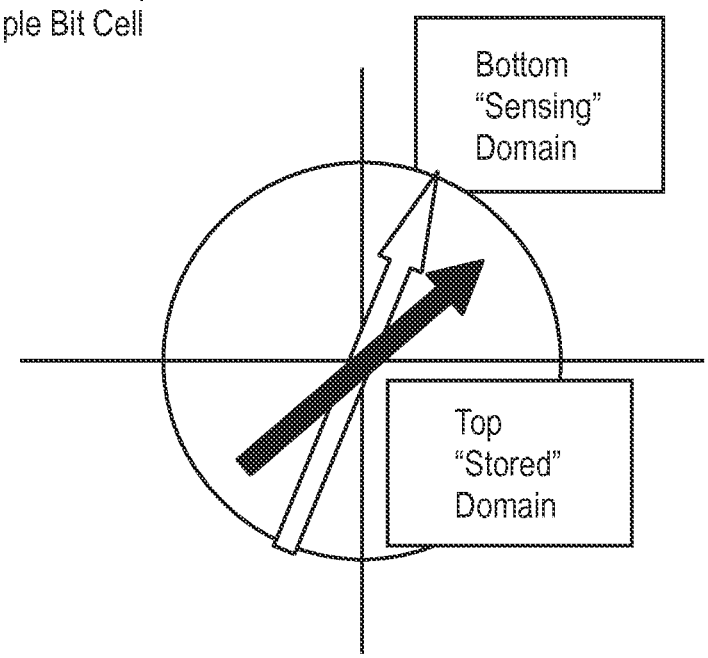
FIG. 14 illustrates a multi-bit MRAM cell that can be included in a check engine, according to an embodiment of the invention.

TAS-MRAM Implementation of Ultra Fast Check Engine with Multiple Bits Per Cell A TAS-MRAM implementation of a check engine can be further extended by including functionality to store and compare multiple bits per magnetic cell, such as by using magnetizations that can be rotated in two dimensions. FIG. 14 illustrates such a check engine, according to an embodiment of the invention. Specifically, a magnetic cell is implemented to store data corresponding to m logic states, with m>2. In other words, the cell is a multi-bit cell that stores a multi-bit data value. Referring to FIG. 14, the cell has a storage magnetization that is switchable between m directions (and between m angles) corresponding to the m logic states, according to a set of reference bits to be stored. In addition, the cell has a sense magnetization that is switchable between the m directions (and between the m angles) corresponding to the m logic states, according to a set of target bits to be compared with the reference bits. A match can be determined when the storage magnetization and the sense magnetization are substantially aligned with respect to one other.

For certain implementations, m can be represented as $m=2^n$, with $n \geq 2$. Here, the cell is an n-bit cell that stores an n-bit data value. One possible encoding scheme assigning m logic states to m distinct angles θ is set forth in Table 1 below. A particular encoding scheme can be selected based on an angular resolution that allows alignment and misalignment of magnetizations to be distinguished. For example, if a resolution of resistance values is 90°, one possible encoding scheme assigning four logic states to four distinct angles θ is set forth in Table 2 below. As additional examples, a 45° resolution can be implemented with an encoding scheme with m=8 and n=3, a 22.5° resolution can be implemented with an encoding scheme with m=16 and n=4, and so forth. It should be understood that other encoding schemes are contemplated. For example, and referring to Table 2, the assignment between m logic states and m angles θ can be permuted, such that the logic state "00" is assigned to 90° (instead of 0°), the logic state "01" is assigned to 0° (instead of 90°), and so forth. As another example, an offset can be added to some, or all, of the angles θ, such that the logic state "00" is assigned to 0°+offset, the logic state "01" is assigned to 90°+offset, and so forth. As further examples, an increment between successive angles θ can be variable, rather than a constant, and certain of the m logic states and certain of the m angles θ can be omitted.

TABLE 1

| Logic State/<br>n-bit data | θ |
|---|---|
| 0...00 | 0° |
| 0...01 | $360°/2^n$ |
| 0...10 | $2(360°/2^n)$ |
| 0...11 | $3(360°/2^n)$ |
| ... | ... |

TABLE 2

| Logic State/<br>2-bit data | θ |
|---|---|
| 00 | 0° |
| 01 | 90° |
| 10 | 180° |
| 11 | 270° |

The multi-bit cell of FIG. 14 can be implemented in a fashion similar to that shown in FIG. 7, in which the bit line 916 functions as another field line. During a programming cycle, at least one of the field line 912 and the bit line 916 (functioning as another field line) is activated to induce a set of magnetic fields to switch the storage magnetization direction to a particular one of m directions. Likewise, during a pattern checking cycle, at least one of the field line 912 and the bit line 916 (functioning as another field line) is activated to induce a set of magnetic fields to switch the sense magnetization direction to a particular one of the m directions. Other implementations of a multi-bit cell are contemplated. For example, and referring to FIG. 9, an additional, dedicated field line can be included above the bit line 916 and can be substantially parallel to the bit line 916. As another example, multiple magnetic tunnel junctions can be included per cell to allow storage and comparison of multi-bit data values by each cell.

Multi-Bit Serial Architecture for Matching Patterns

Figure 8:
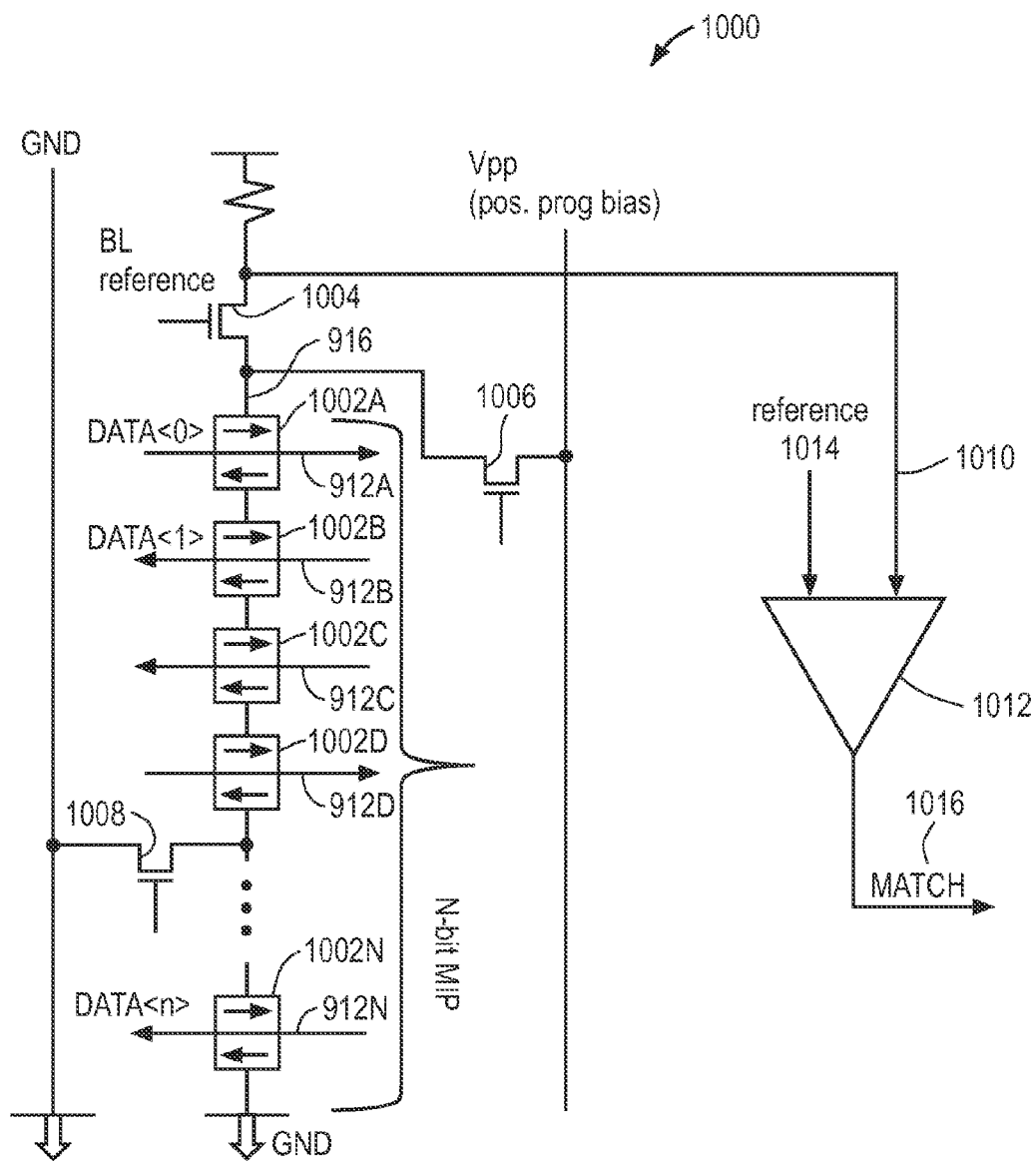
FIG. 8 illustrates a check engine including comparators connected in series, according to an embodiment of the invention.

FIG. 8 illustrates a check engine 1000 including comparators 1002A-1002N connected in series, according to an embodiment of the invention. Each comparator 1002 may have the characteristics of the comparator described with reference to FIG. 5. Similar to the comparator of FIG. 5, each comparator of FIG. 8 may be a single-bit cell that can be used to store and compare a single-bit data value. Alternatively, one or more of the comparators 1002 may be a multi-bit cell as described with reference to FIG. 14. Referring to FIG. 8, N comparators, where N is at least 2, may be included to allow checking of N-bit patterns. In one embodiment, the comparators 1002 may correspond to the magnetic cells 902 previously described with reference to FIG. 7.

The check engine 1000 of FIG. 8 has a serial architecture for match-in-place (MIP) applications. In MIP applications, an N-bit target pattern, represented by DATA<0> to DATA<n>, is compared to an N-bit stored pattern. The target pattern and the stored pattern may be binary patterns, though it is contemplated that each of DATA<0> to DATA<n> could represent data with more than two levels. In one embodiment, one distinct bit of the N-bit stored pattern is stored in each of the comparators 1002. The stored bit of each comparator 1002 may be stored in a storage layer (such as storage layer 906, with reference to FIG. 7) included in each comparator 1002. Each comparator 1002 performs a comparison of its stored bit to a corresponding bit of the N-bit target pattern. As described previously, in a pattern checking mode, the comparator acts as a two terminal device, namely a "0" or a "1" is presented at an input of the comparator, and a response of "yes" (match) or "no" (no match) based on the comparison is presented at an output of the comparator.

As described previously with reference to FIG. 5, a "0" or a "1" can be presented to a comparator by applying a magnetic field induced by a field line. Referring to FIGS. 7 and 8, each comparator 1002 may have its own field line 912, so that the write magnetic field and the compare magnetic field applied to each comparator 1002 can be controlled independently.

In one embodiment, the comparators 1002 may be connected to the common bit line 916 for application of heating current to the comparators 1002. Application of heating current may be controlled by a transistor 1004 or another device, such as a switch, configured to allow heating current to flow to the comparators 1002. In another embodiment, multiple transistors or switches may separately control application of heating current to subsets of the comparators 1002. For example, as shown in FIG. 8, transistors 1006 and 1008 may be configured to allow heating current to flow to the comparators 1002A-1002D. Other transistors or switches (not shown) may be included to allow heating current to flow to other subsets of the comparators 1002. These subsets of the comparators 1002 may include one, two, three, four, or more comparators. Maximum power requirements of the check engine 1000 may be reduced through separate control of the application of heating current to subsets of the comparators 1002, as power requirements for heating subsets of the comparators 1002 separately can be less than power requirements for heating all of the comparators 1002 together.

As described previously with reference to FIG. 5, the output of each comparator 1002 can be analog in nature. For example, in the case of a pair of magnetization directions, a low resistance value (e.g., about 1 K$\Omega$, though the resistance is not restricted to this value) can be presented for a "yes" match (e.g., when the storage magnetization and sense magnetization directions are substantially parallel), while a high resistance value (e.g., about 2 K$\Omega$, though the resistance is not restricted to this value) can be presented for a "no" match (e.g., when the storage magnetization and sense magnetization directions are substantially antiparallel).

Referring to FIG. 8, outputs of the comparators 1002 can be combined to create a combined output. If the comparators 1002 are connected in series, then the resistances of the comparators 1002 can be added to obtain a combined resistance. An input 1010 (such as voltage or current) to a sense amplifier 1012 is based on the combined resistance of the comparators 1002. Power consumption requirements, and correspondingly, thermal dissipation requirements of the check engine 1000 may be reduced by using the single sense amplifier 1012 to process the output 1010 of multiple comparators 1002, as compared to an architecture in which the output of each comparator is processed by a separate sense amplifier. In one embodiment, it is contemplated that the single sense amplifier 1012 may process the output of 16, 32, 64, 128, or more comparators 1002 in series. The single sense amplifier 1012 may also process the output of N comparators 1002 in series, where N is not a multiple of two. The sense amplifier 1012 compares the input 1010 to a reference 1014, and sets a match output 1016 based on the result of the comparison. The reference 1014 may be a predetermined threshold. Alternatively, the sense amplifier 1012 may determine the combined resistance of the comparators 1002 based on the input 1010, and may compare this determined value of the combined resistance to the reference 1014. For example, the match output 1016 may be set to a high value if the input 1010 is less than the reference 1014, a low value if the input 1010 is greater than the reference 1014, and either the high value or the low value if the input 1010 is equal to the reference 1014. Alternatively, the match output 1016 may be set to a low value if the input 1010 is less than the reference 1014, and may be set to a high value if the input 1010 is greater than the reference 1014.

In one embodiment, the reference 1014 is configured to distinguish between a full match (match of all bits) of a stored pattern and a target pattern determined by the comparators 1002, and a mismatch of the stored pattern and the target pattern in which any one of the comparators 1002 determines a mismatch of at least one bit of the stored pattern and the target pattern. The reference 1014 may be configured to a value between a first value of the input 1010 corresponding to the full match and a second value of the input 1010 corresponding to the mismatch determined by one of the comparators 1002. In one embodiment, the reference 1014 may be configured to a value halfway between the first value and the second value. Alternatively, if it is desired to reduce the probability of a false match indication, the reference 1014 may be configured to a value closer to the second value. Alternatively, if it is desired to reduce the probability of a false mismatch indication, the reference 1014 may be configured to a value closer to the first value.

Alternatively, the reference 1014 may be configured such that a match is determined when not all of the bits of the target pattern match corresponding bits of the stored pattern, e.g., one or more bits of the target pattern does not match a corresponding one or more bits of the stored pattern.

In a first embodiment, a match of a stored pattern and a target pattern may correspond to a "yes" match at each of the comparators 1002 (e.g., when the storage magnetization and sense magnetization directions are substantially parallel at each of the comparators 1002). Alternatively, in a second embodiment, a match of a stored pattern and a target pattern may correspond to a "no" match at each of the comparators 1002 (e.g., when the storage magnetization and sense magnetization directions are substantially antiparallel at each of the comparators 1002).

In an illustrative example of the first embodiment (match corresponds to parallel magnetization directions), if there are twenty comparators 1002 connected in series and the resistance of each comparator corresponding to a match (in this embodiment, a "yes" match) is known to be an ideal value of 1 K$\Omega$, then the combined resistance corresponding to a match of a stored pattern and a target pattern determined by the twenty comparators 1002 is ideally 20 K$\Omega$. If one of the comparators 1002 determines a mismatch (in this embodiment, a "no" match) and the resistance of the comparator corresponding to a mismatch is known to be an ideal value of 2 K$\Omega$, then the combined resistance is ideally 21 K$\Omega$.

In an illustrative example of the second embodiment (match corresponds to antiparallel magnetization directions), if there are twenty comparators 1002 connected in series and the resistance of each comparator corresponding to a match (in this embodiment, a "no" match) is known to be an ideal value of 2 K$\Omega$, then the combined resistance corresponding to a match of a stored pattern and a target pattern determined by the twenty comparators 1002 is ideally 40 K$\Omega$. If one of the comparators 1002 determines a mismatch (in this embodiment, a "yes" match) and the resistance of the comparator corresponding to a mismatch is known to be an ideal value of 1 K$\Omega$, then the combined resistance is ideally 39 K$\Omega$.

However, in reality, the resistances of the comparators 1002 vary around the ideal value due to factors such as manufacturing variations, environmental variations, and aging. Due to these variations, the combined resistance corresponding to a full match by a particular set of comparators 1002 is typically unknown. To more accurately determine the reference 1014, the set of comparators 1002 within the check engine 1000 may be configured so that the comparators 1002 have a combined resistance corresponding to a full match.

This is known as self-referencing of the comparators 1002 to a full matching configuration. If the number of comparators 1002 in the set is small, self-referencing may not be needed if the variations of the resistances of the comparators 1002 around the ideal value are sufficiently small. Alternatively, if the number of comparators 1002 in the set is large, such as four or more, self-referencing may be used.

In one embodiment, during self-referencing the combined resistance of the comparators 1002 corresponding to a full match may be measured. Alternatively or in addition, the input 1010 corresponding to this combined resistance of the comparators 1002 may be measured. The reference 1014 may be determined from at least one of the combined resistance of the comparators 1002 corresponding to a full match and the input 1010 corresponding to this combined resistance of the comparators 1002.

For example, continuing the example of the first embodiment (match corresponds to parallel magnetization directions), the combined resistance of the comparators 1002 corresponding to a full match may be determined to be a value between 20 KΩ and 21 KΩ, such as 20.47 KΩ. In this embodiment, once this combined resistance corresponding to a full match is determined, the reference 1014 can be more accurately determined. In this example, the resistance of a comparator 1002 corresponding to a mismatch may still have some uncertainty. For example, this resistance may range between 1.95 KΩ and 2.05 KΩ. However, this uncertainty, because it is associated with a single comparator 1002, may be significantly less than the uncertainty in the combined resistance of the comparators 1002 corresponding to a full match that has been removed by self-referencing.

In the first embodiment (match corresponds to parallel magnetization directions), to perform self-referencing of the comparators 1002 connected in series to a full matching configuration, the storage magnetization and sense magnetization directions of each of the comparators 1002 can be aligned to mimic a full matching configuration. In one embodiment, to align the stored magnetization and the sense magnetization directions of the comparators 1002 in parallel, the field lines 912 can generate an applied magnetic field $H_{parallel}$ in the direction parallel to the sense magnetization that is greater than the sum of $H_{exchange}$ and $H_{coupling}$. The exchange magnetic field $H_{exchange}$ corresponds to the magnetic field needed to overcome the stored magnetization (if antiparallel to the sense magnetization), in the absence of coupling between the stored magnetization and the sense magnetization. The magneto-static coupling magnetic field $H_{coupling}$ corresponds to the magnetic field needed to overcome the antiparallel component of the sense magnetization due to coupling with the stored magnetization. While applying the magnetic field $H_{parallel}$, the storage magnetization and the sense magnetization directions can be aligned in parallel, regardless of the stored data in the comparators 1002, and also without unpinning the storage magnetization direction. Because the storage magnetization direction is not unpinned, when the magnetic field $H_{parallel}$ is removed, the storage magnetization can return to its stored value.

In the second embodiment (match corresponds to antiparallel magnetization directions), to perform self-referencing of the comparators 1002 connected in series to a full matching configuration, no applied magnetic field analogous to $H_{parallel}$ is needed. Instead, the storage magnetization and sense magnetization directions of each of the comparators 1002 may be self-aligned in an antiparallel state by magneto-static coupling between the storage magnetization and the sense magnetization. As described previously with reference to FIG. 7, the sense layer 904 can include a soft ferromagnetic material, namely one having a relatively low coercivity, while the storage layer 906 can include a hard ferromagnetic material, namely one having a relatively high coercivity. In one embodiment, the sense layer 904 is a non-synthetic material that includes an alloy of Ni and Fe (and optionally B), as such an alloy can have a smaller coercivity than alloys based on Co and Fe (and optionally B). In such manner, a magnetization of the sense layer 904 can be easily self-aligned by coupling with the storage magnetization, and also can be readily varied under low-intensity magnetic fields during pattern checking cycles, while a magnetization of the storage layer 906 remains stable.

In one embodiment, self-referencing of the comparators 1002 can be performed when programming or configuring the check engine 1000, or on power up of the check engine 1000. In this embodiment, self-referencing is not performed as part of matching a target pattern to a stored pattern, so the matching still can occur in one cycle. Alternatively or in addition, self-referencing of the comparators 1002 can be performed on the fly. For example, self-referencing of the comparators 1002 can be performed in a separate cycle prior to matching a target pattern to a stored pattern, so that the matching (including the cycle for self-referencing) can take two cycles to complete. Alternatively or in addition, self-referencing of the comparators 1002 can be performed periodically. In one embodiment, a measured value from the self-referencing of the comparators 1002, such as a measured value of the combined resistance or a measured value of the input 1010, can be latched into a sample-and-hold circuit so that the measured value is available for a predetermined time period dependent on the design of the sample-and-hold circuit.

As described previously, when matching is configured to correspond to parallel magnetization directions, the applied magnetic field $H_{parallel}$ is generated as part of self-referencing. Configuring matching to correspond to antiparallel magnetization directions may be advantageous because there is no need to generate the applied magnetic field $H_{parallel}$ as part of self-referencing. This can result in reduced power consumption and reduced heat generation, and can also reduce the complexity of circuitry associated with the check engine 1000.

Referring to FIG. 7, in one embodiment, the magneto-static coupling between the storage layer 906 and the sense layer 904 can be reduced by forming the storage layer 906 from a synthetic material having multiple layers. For example, the storage layer 906 may include a first ferromagnetic layer and a second ferromagnetic layer separated by an spacer layer. The spacer layer may be formed from a material such as rutinium. The second ferromagnetic layer may be disposed between the spacer layer and the layer 908, which as previously described, may be an insulating layer. The first ferromagnetic layer may store the stored magnetization. Magneto-static coupling between the first ferromagnetic layer and the second ferromagnetic layer may result in a magnetization of the second ferromagnetic layer that is antiparallel to the stored magnetization in the first ferromagnetic layer. The magnetizations of the first ferromagnetic layer and the second ferromagnetic layer may both couple into the sense layer 904. Since these magnetizations have antiparallel directions, the coupling components of these magnetizations in the sense layer 904 tend to cancel each other, which can result in a reduced coupling magnetic field in the sense layer 904. This reduction in the coupling magnetic field in the sense layer 904 may be desirable to reduce the applied magnetic field $H_{parallel}$ generated as part of self-referencing when matching corresponds to parallel magnetization directions. This reduction in the coupling magnetic field in the sense layer 904 may also be desirable to facilitate writing in the sense layer 904.

The architecture of FIG. 8 can be extended for the design of 32-bit, 64-bit, 128-bit, and higher bit serial architectures by including additional comparators along the input line, such as by including 32 comparators for a 32-bit design. However, the architecture of FIG. 8 is not limited to architectures for matching a number of bits that is a multiple of two. If a higher level of certainty is desired for a positive match, the number of bits to be checked concurrently can be set lower than when a lower level of certainty is sufficient. Depending upon the particular implementation, a large number of bits checked concurrently can have a lower level of certainty due to a degraded signal-to-noise ratio. For fingerprint recognition, as an example, a relatively large number of bits can be checked concurrently, since identifying a "perfect" match can be less important that other applications. In the case of checking electronic keys, a large key can be parsed and segmented into smaller increments that are separately checked to allow a higher level of certainty.

Figure 9:
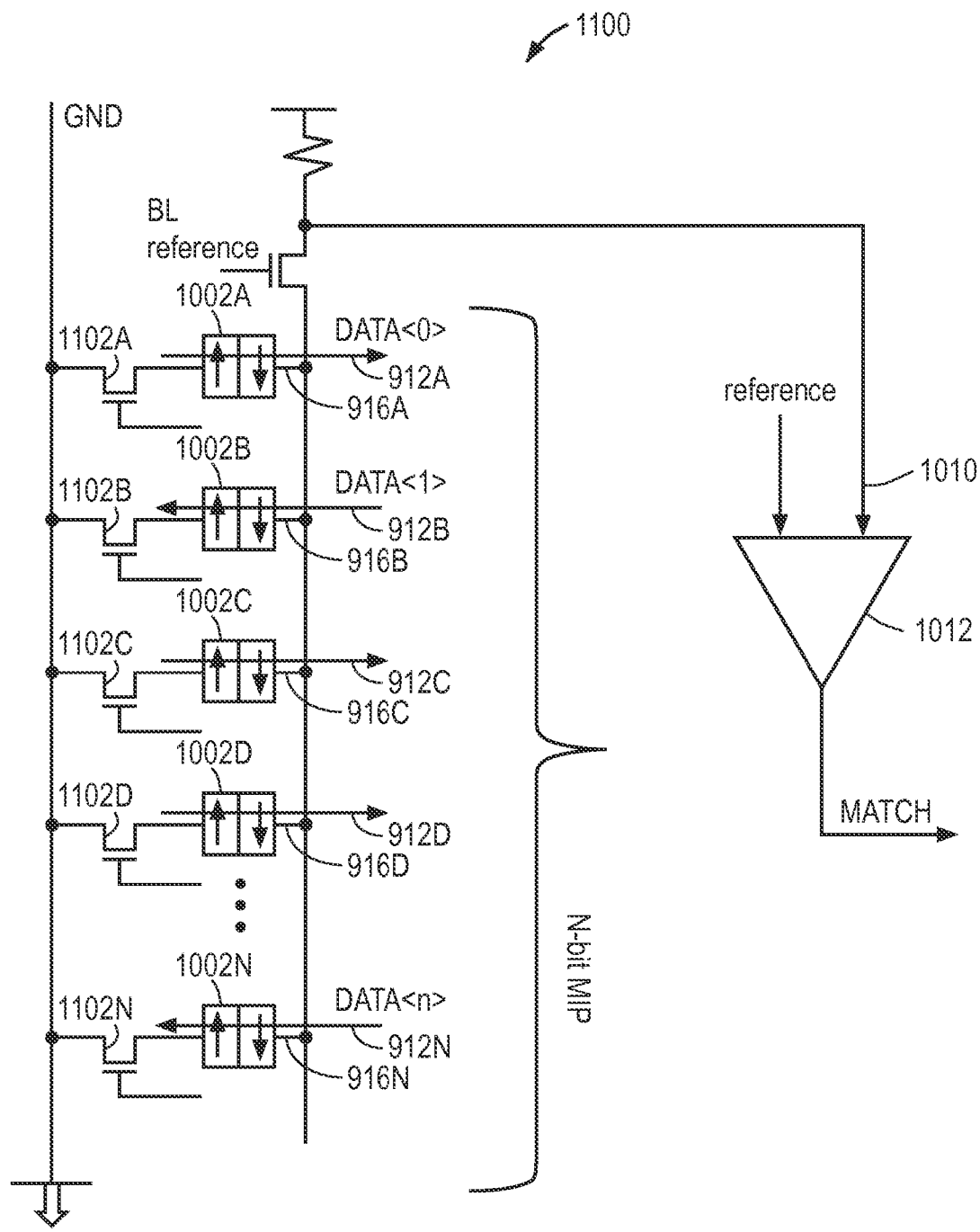
FIG. 9 illustrates a check engine including comparators connected in parallel, according to an embodiment of the invention.

FIG. 9 illustrates a check engine 1100 including comparators 1002A-1002N connected in parallel, according to an embodiment of the invention. Each comparator 1002 has the characteristics of the comparator described with reference to FIG. 5. The check engine 1100 is in many respects similar to the check engine 1000 described with reference to FIG. 8, so aspects of the check engine 1100 that are different are primarily discussed here.

The check engine 1100 has a parallel architecture for match-in-place (MIP) applications. In one embodiment, the comparators 1002A-1002N are connected in parallel. The comparators 1002A-1002N may each be connected to a corresponding bit line 916A-916N. In one embodiment, the comparators 1002A-1002N may each be connected to a corresponding selection transistor 1102A-1102N. Heating current through the bit lines 916A-916N can be controlled by the transistor 1004 and the selection transistors 1102. In one embodiment, each of the comparators 1002A-1002N may be connected to a corresponding field line 912A-912N.

As described previously with reference to FIG. 8, outputs of the comparators 1002 can be combined to create a combined output. In the embodiment of FIG. 9, the combined resistance of the comparators 1002 connected in parallel can be determined from the resistances of the individual comparators 1002 in a manner known to one of ordinary skill in the art. The input 1010 (such as voltage or current) to the sense amplifier 1012 is based on the combined resistance of the comparators 1002.

As compared to the embodiment of FIG. 8, the combined resistance of the comparators 1002 in the check engine 1100 is lower. The power consumption of the check engine 1100 may correspondingly be higher than that of the check engine 1000. In many other respects, the check engine 1100 operates similarly to the check engine 1000.

Figure 10:
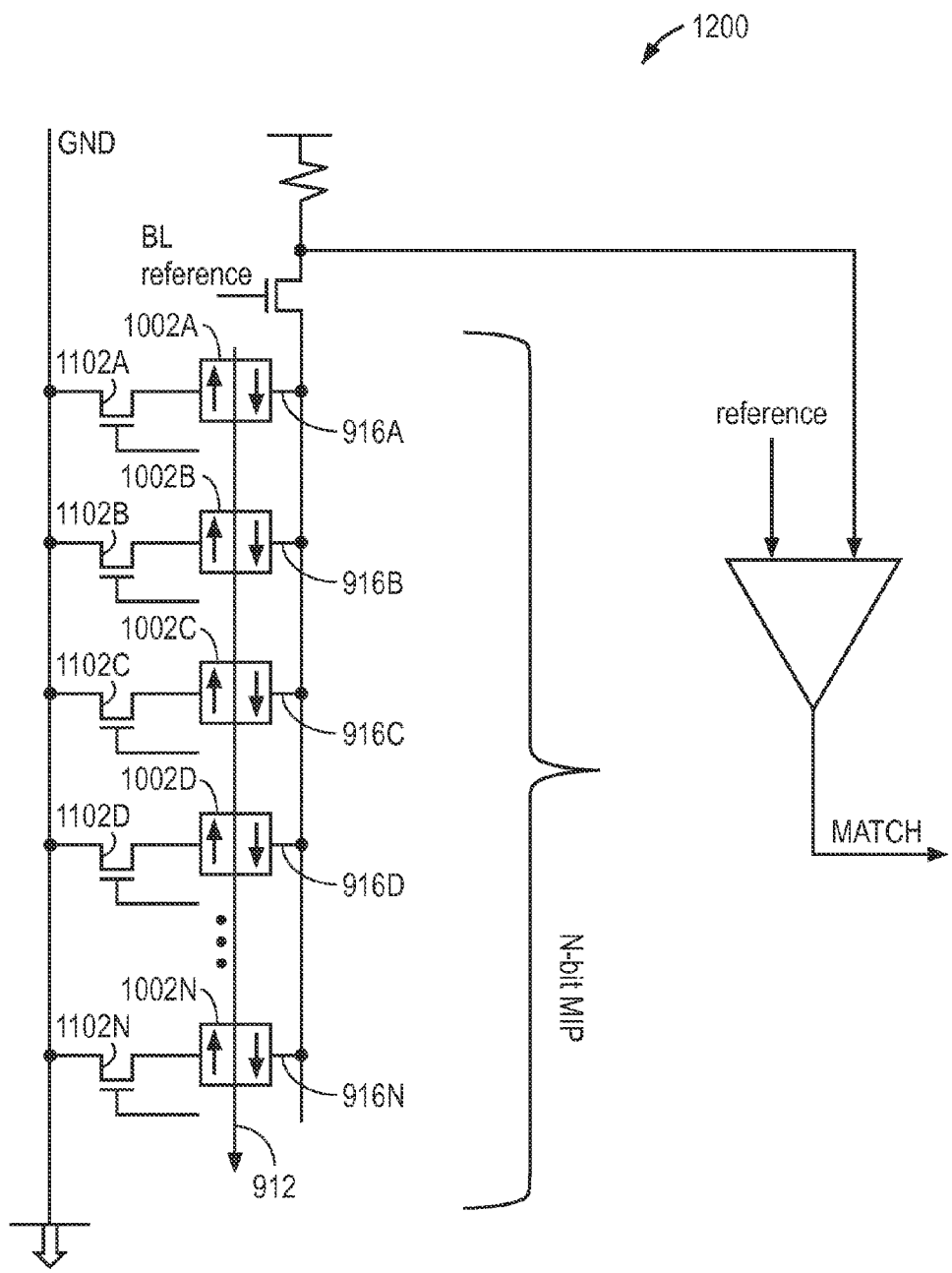
FIG. 10 illustrates a check engine including comparators connected in parallel and connected through a common field line, according to an embodiment of the invention.

FIG. 10 illustrates a check engine 1200 including comparators 1002A-1002N connected in parallel and connected through a common field line, according to an embodiment of the invention. Each comparator 1002 has the characteristics of the comparator described with reference to FIG. 5. The check engine 1200 is in many respects similar to the check engine 1100 described with reference to FIG. 9, so aspects of the check engine 1100 that are different are primarily discussed here.

Referring to FIG. 10, the comparators are connected together through the common field line 912 shared by the comparators 1002. Sharing of the field line 912 by the comparators 1002 can reduce power consumption as compared to architectures in which each comparator 1002 is connected to a separate field line. The field line 912 can apply a magnetic field to program a set of reference bits during a programming cycle or to present a set of target bits during a pattern checking cycle. In this embodiment, "0's" and "1's" of a target pattern are checked in separate cycles. In one cycle, all "0's" of the target pattern are checked concurrently by presenting a "0" through the field line 912 and selecting particular ones of the comparators 1002 (which are candidates for storing "0's") through their respective bit lines 916 and their respective selection transistors 1102. A result of checking for "0's" can account for an output of each selected comparator 1002, or can correspond to an aggregate of some, or all, of the outputs of the selected comparators 1002. For example, the result can be a "yes" if there is a positive match for each selected comparator 1002, and can be a "no" otherwise. As another example, the result can be a "yes" if there is a positive match for at least a particular percentage of the selected comparators 1002, and can be a "no" otherwise. If the result of checking for "0's" is a "no", a next cycle to check "1's" can be skipped. Also, even if all "0's" are checked as a "yes", a decision can be made to skip the next cycle and assert that a match is statistically likely. If a higher level of certainty is desired, all "1's" can be checked concurrently in the next cycle by presenting a "1" through the field line 912 and selecting particular ones of the comparators 1002 (which are candidates for storing "1's") through their respective bit lines 916 and their respective selection transistors 1102. An overall result of checking can be available within about 20 ns or less if only "0's" are checked, and within about 2×20 ns if both "0's" and "1's" are checked in successive cycles.

In one embodiment, self-referencing of the comparators 1002 can be performed when programming or configuring the check engine 1000, or on power up of the check engine 1000. However, with reference to the embodiment of FIG. 10, additional references should be programmed as compared to the embodiments of FIGS. 8 and 9. Since "0's" and "1's" are checked in separate cycles, a separate reference is needed for at least some subsets of the comparators 1002 that could correspond to the locations of "0's" and "1's" in a target pattern. In one embodiment, a separate reference can be provided for each of one matching comparator 1002, two matching comparators 1002, and so on up to N matching comparators 1002, where N is the total number of comparators 1002 connected in parallel.

Alternatively, self-referencing of the comparators 1002 can be performed in a separate cycle prior to matching a target pattern to a stored pattern. In this approach, for example, a subset of the comparators 1002 corresponding to locations of "0's" in the target pattern are self-referenced prior to matching "0's" in the target pattern to the stored pattern. The selection transistors 1102 corresponding to this subset of the comparators 1002 are saturated to allow current to flow through each of this subset of the comparators 1002. The selection transistors 1102 corresponding to the remainder of the comparators 1002 are turned off so that current does not flow through the remainder of the comparators 1002. Self-referencing of a subset of the comparators 1002 corresponding to locations of "1's" in the target pattern may be performed in a similar way. In the embodiment of FIG. 10, it may be advantageous to perform self-referencing in this way so that separate configuration of N references can be avoided. However, this type of self-referencing can add an additional cycle to each match.

To speed up operation of embodiments in which a match takes multiple cycles to complete, the processing associated with the match can be allocated across multiple check engines such as the check engines 1000, 1100, and 1200. For example, with reference to FIG. 10, self-referencing and matching corresponding to "0's" in a target pattern can be performed by a first check engine 1200, while self-referencing and matching corresponding to "1's" in the target pattern can be performed in parallel by a second check engine 1200.

Referring to FIGS. 6 through 11, the comparators 102 may correspond to the comparators 200 and 1002. In one embodiment, the generator 104 of the output of multiple comparators 102 may correspond to a device, such as electronic circuitry, electrically connected to each the comparators 200 and 1002. The generator 104 may evaluate outputs of individual ones of the comparators 200. Alternatively, the generator 104 may aggregate (combine) outputs (such as voltage or current outputs) of the comparators 200 and 1002. In one embodiment, the output 110 of the generator 104 may correspond to the input 1010 to the sense amplifier 1012 (see FIGS. 8 and 9), the match determiner 106 may correspond to the sense amplifier 1012, the threshold 112 may correspond to the reference 1014, and the match output 114 may correspond to the match output 1016.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A check engine comprising:
   a plurality of comparators each including:
      a first directional characteristic aligned to store at least one reference bit included in a set of reference bits; and
      a second directional characteristic aligned to present at least one target bit included in a set of target bits;
      wherein each of the plurality of comparators is configured to produce an output representing a level of matching between the at least one target bit and the at least one reference bit, based on a relative alignment between the first directional characteristic and the second directional characteristic; and
      wherein the check engine is configured such that the outputs of the plurality of comparators are combined to produce a combined output;
   wherein the check engine is configured to determine that the set of target bits matches the set of reference bits based on the combined output of the plurality of comparators;
   wherein to determine that the set of target bits matches the set of reference bits, the check engine is configured to compare the combined output of the plurality of comparators to a self-referenced output of the plurality of comparators corresponding to a full matching configuration; and
   wherein the check engine is configured to determine the self-referenced output of the plurality of comparators in a separate cycle prior to determining that the set of target bits matches the set of reference bits.

2. The check engine of claim 1, wherein the plurality of comparators are connected in series to produce the combined output.

3. The check engine of claim 1, wherein the plurality of comparators are connected in parallel to produce the combined output.

4. The check engine of claim 1, wherein the output of each of the plurality of comparators represents a match between the at least one target bit and the at least one reference bit, the match corresponding to a substantially parallel alignment of the first directional characteristic and the second characteristic.

5. The check engine of claim 1, wherein the output of each of the plurality of comparators represents a match between the at least one target bit and the at least one reference bit, the match corresponding to a substantially antiparallel alignment of the first directional characteristic and the second characteristic.

6. The check engine of claim 1, wherein:
   if the set of target bits matches the set of reference bits, the plurality of comparators has a first combined resistance;
   if the set of target bits does not match the set of reference bits, the plurality of comparators has a second combined resistance; and
   the second combined resistance is not equal to the first combined resistance.

7. The check engine of claim 6, wherein the second combined resistance is less than the first combined resistance.

8. The check engine of claim 1, wherein the plurality of comparators are configurable by a common field line.

9. The check engine of claim 1, wherein:
   at least one of the plurality of comparators is a magnetic random access memory (MRAM) cell; and
   the first directional characteristic and the second directional characteristic correspond to a storage magnetization and a sense magnetization, respectively.

10. The check engine of claim 1, wherein at least one of the plurality of comparators includes:
    a first directional characteristic aligned to store multiple reference bits included in the set of reference bits; and
    a second directional characteristic aligned to present multiple target bits included in the set of target bits;
    wherein the at least one of the plurality of comparators produces an output representing a level of matching between the multiple target bits and the multiple reference bits.

11. The check engine of claim 10, wherein a first field line and a second field line are configurable to set the first directional characteristic to store the multiple reference bits.

12. The check engine of claim 11, wherein the first field line is substantially orthogonal to the second field line.

13. A method of operating a check engine, comprising:
    providing a plurality of magnetic random access memory (MRAM) cells in the check engine, each of the plurality of MRAM cells including a storage magnetization and a sense magnetization;
    storing a plurality of reference bits in the plurality of MRAM cells, including during a programming cycle, aligning the storage magnetization of the each of the MRAM cells to store at least one of the plurality of reference bits;
    presenting a plurality of target bits to the plurality of MRAM cells, including during a pattern checking cycle, aligning the sense magnetization of the each of the plurality of MRAM cells to present at least one of the plurality of target bits; and generating an output representing a level of matching between the plurality of target bits and the plurality of reference bits, based on a relative alignment between the storage magnetization and the sense magnetization of the each of the MRAM cells;

wherein the output represents a percentage of the plurality of target bits that match the plurality of reference bits.

14. The method of claim 13, further comprising determining a match between the plurality of target bits and the plurality of reference bits when the output is greater than or equal to a predetermined threshold.

15. The method of claim 14, further comprising determining the predetermined threshold based on a self-referenced output of the plurality of MRAM cells corresponding to a full matching configuration.

16. The method of claim 14, wherein the predetermined threshold is settable such that the match is determined when one or more of the plurality of target bits does not match a corresponding one or more of the plurality of reference bits.

17. The method of claim 13, wherein:

if the plurality of target bits matches the plurality of reference bits, the plurality of MRAM cells has a first combined resistance;

if the plurality of target bits does not match the plurality of reference bits, the plurality of MRAM cells has a second combined resistance;

the second combined resistance is not equal to the first combined resistance; and the output is generated based on at least one of the first combined resistance and the second combined resistance.

* * * * *